(12) United States Patent
Lee

(10) Patent No.: US 12,225,726 B2
(45) Date of Patent: Feb. 11, 2025

(54) MEMORY DEVICE AND METHOD OF MANUFACTURING THE SAME

(71) Applicant: SK hynix Inc., Icheon-si Gyeonggi-do (KR)

(72) Inventor: Nam Jae Lee, Cheongju-si Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 170 days.

(21) Appl. No.: 17/975,241

(22) Filed: Oct. 27, 2022

(65) Prior Publication Data

US 2023/0051615 A1 Feb. 16, 2023

Related U.S. Application Data

(62) Division of application No. 16/880,678, filed on May 21, 2020, now Pat. No. 11,527,549.

(30) Foreign Application Priority Data

Oct. 4, 2019 (KR) ........................ 10-2019-0123129

(51) Int. Cl.
*H10B 43/27* (2023.01)
*H10B 43/10* (2023.01)
*H10B 43/40* (2023.01)

(52) U.S. Cl.
CPC ............. *H10B 43/27* (2023.02); *H10B 43/10* (2023.02); *H10B 43/40* (2023.02)

(58) Field of Classification Search
CPC ..................................................... H10B 43/27
See application file for complete search history.

(56) References Cited

U.S. PATENT DOCUMENTS

| | | |
|---|---|---|
| 9,437,606 B2 | 9/2016 | Makala et al. |
| 9,449,987 B1 | 9/2016 | Miyata et al. |
| 9,716,105 B1 | 7/2017 | Tsutsumi |
| 10,141,331 B1 | 11/2018 | Susuki et al. |
| 11,075,084 B2 | 7/2021 | Shen et al. |
| 2013/0099306 A1 | 4/2013 | Choi et al. |
| 2014/0061776 A1 | 3/2014 | Kwon et al. |
| 2016/0322381 A1 | 11/2016 | Liu et al. |
| 2017/0287926 A1 | 10/2017 | Ariyoshi |
| 2018/0301374 A1 | 10/2018 | Masamori et al. |

(Continued)

FOREIGN PATENT DOCUMENTS

| | | |
|---|---|---|
| CN | 102468283 A | 5/2012 |
| CN | 104396004 A | 3/2015 |

(Continued)

*Primary Examiner* — Christopher A Johnson
(74) *Attorney, Agent, or Firm* — WILLIAM PARK & ASSOCIATES LTD.

(57) ABSTRACT

A memory device and a method of manufacturing the memory device includes a stacked structure having a cell region and a slimming region. The memory device also includes a plurality of vertical channel structures each including memory cells and vertically passing through the stacked structure in the cell region. The memory device further includes a plurality of support structures each having a structure of each of the vertical channel structures and vertically passing through the stacked structure in the slimming region. The plurality of support structures have different heights depending on the shape of the stacked structure in the slimming region.

4 Claims, 14 Drawing Sheets

(56) References Cited

U.S. PATENT DOCUMENTS

| | | |
|---|---|---|
| 2018/0342531 A1 | 11/2018 | Susuki et al. |
| 2019/0035807 A1 | 1/2019 | Kim et al. |
| 2020/0127006 A1* | 4/2020 | Otsu .................. H10B 43/40 |

FOREIGN PATENT DOCUMENTS

| | | |
|---|---|---|
| CN | 105226063 A | 1/2016 |
| CN | 106887404 A | 6/2017 |
| CN | 107425005 A | 12/2017 |
| CN | 107464816 A | 12/2017 |
| CN | 107810552 A | 3/2018 |
| CN | 108511455 A | 9/2018 |
| CN | 109075174 A | 12/2018 |
| CN | 109148470 A | 1/2019 |
| CN | 109216366 A | 1/2019 |
| CN | 109427795 A | 3/2019 |
| CN | 109716521 A | 5/2019 |
| CN | 109768049 A | 5/2019 |
| IN | 108022929 A | 5/2018 |
| KR | 1020100097459 A | 9/2010 |
| KR | 101589275 B1 | 1/2016 |
| WO | 2016043990 A1 | 3/2016 |
| WO | 2016085581 A1 | 6/2016 |

\* cited by examiner

MEMORY DEVICE AND METHOD OF MANUFACTURING THE SAME

CROSS-REFERENCE TO RELATED APPLICATION

The present application is a divisional application of U.S. patent application Ser. No. 16/880,678, filed on May 21, 2020, and claims priority under 35 U.S.C. § 119(a) to Korean patent application number 10-2019-0123129, filed on Oct. 4, 2019, in the Korean Intellectual Property Office, the entire disclosure of which is incorporated herein by reference.

BACKGROUND

1. Technical Field

Various embodiments of the present disclosure generally relate to a memory device and a method of manufacturing the memory device, and more particularly, to a memory device including memory cells stacked in a direction perpendicular to a substrate, and a method of manufacturing the memory device.

2. Related Art

Memory devices may include volatile memory for which stored data is lost when power is interrupted. Memory devices may also include non-volatile memory for which stored data is retained even when power is interrupted.

With the growing popularity of portable electronic devices such as cellular phones and notebooks, non-volatile memory devices with increased capacity and degree of integration are in demand.

The potential for further improving the degree of integration of two-dimensional non-volatile memory devices including memory cells formed on a substrate in a single layer is limited. Therefore, three-dimensional (3D) non-volatile memory devices including memory cells stacked in a vertical direction on a substrate have been proposed.

SUMMARY

In accordance with an embodiment of the present disclosure is a memory device including a stacked structure having a cell region and a slimming region. The memory device also includes a plurality of vertical channel structures each including memory cells and vertically passing through the stacked structure in the cell region. The memory device further includes a plurality of support structures each having a structure identical with a structure of each of the vertical channel structures and vertically passing through the stacked structure in the slimming region. The plurality of support structures have different heights depending on a shape of the stacked structure in the slimming region.

In accordance with an embodiment of the present disclosure is a memory device including a first stacked structure defining a cell region and a slimming region. The memory device also includes a second stacked structure defining the cell region and the slimming region, wherein the second stacked structure is stacked on the first stacked structure. The memory device further includes a plurality of vertical channel structures passing through the first and the second stacked structures in the cell region. The memory device additionally includes a plurality of support structures each having a structure identical with a structure of each of the vertical channel structures and passing through the first and the second stacked structures in the slimming region. The plurality of support structures have different heights depending on shapes of the first and the second stacked structures formed in the slimming region.

In accordance with an embodiment of the present disclosure is a method of manufacturing a memory device. The method includes providing a stacked structure having a cell region and a slimming region. The method also includes forming vertical channel structures in the stacked structure in the cell region. The method further includes forming support structures, each having a structure identical with each of the vertical channel structure, in the stacked structure in the slimming region simultaneously with forming the vertical channel structures. The method additionally includes performing a slimming process so that the stacked structure in the slimming region and the support structures have a stepped structure.

DETAILED DESCRIPTION

Figure 1:
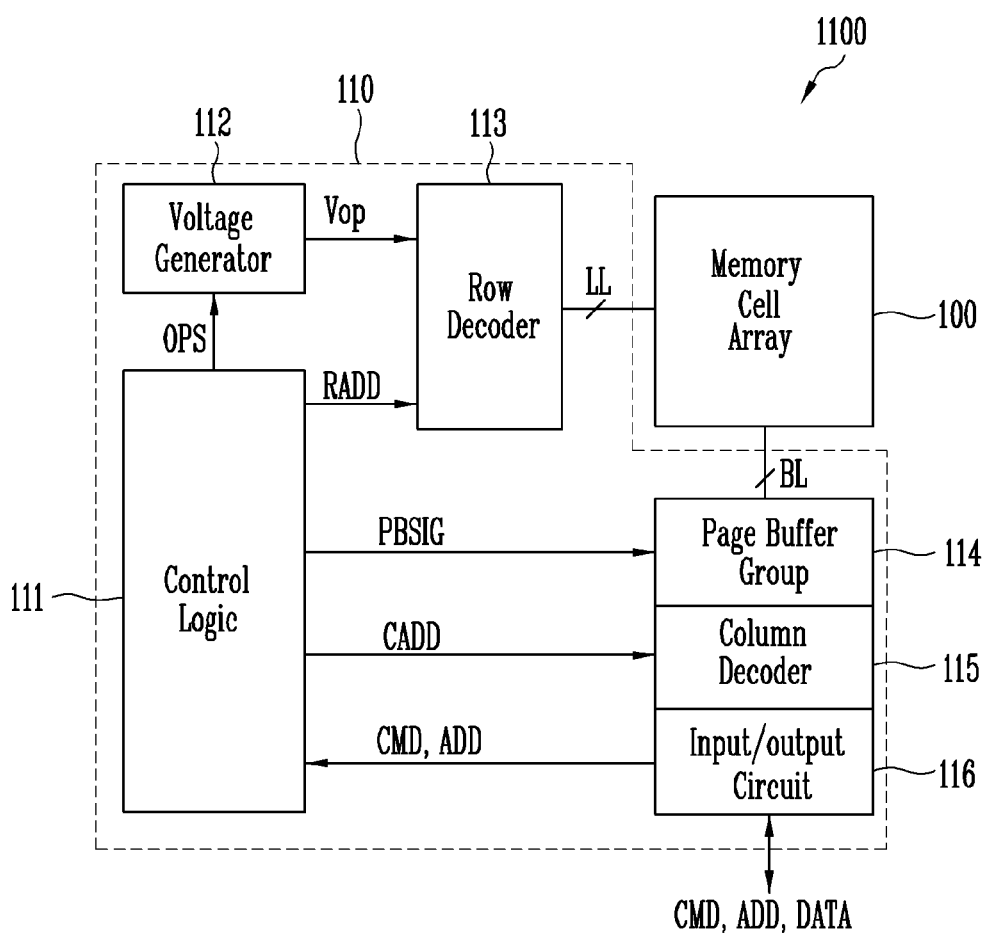
FIG. 1 is a diagram illustrating a memory device in accordance with an embodiment of the present disclosure.

FIG. 1 is a diagram illustrating a memory device 1100 in accordance with an embodiment of the present disclosure.

Referring to FIG. 1, the memory device 1100 may include a memory cell array 100 configured to store data, and peripheral circuits 110 configured to perform a program operation, a read operation, or an erase operation of the memory cell array 100.

The memory cell array 100 may include a plurality of memory blocks each including non-volatile memory cells.

Local lines LL may be coupled to each of the memory blocks. Bit lines BL may be coupled in common to the memory blocks.

The peripheral circuits 110 may include control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 in response to a command CMD and an address ADD. For example, the control logic 111 may output an operating signal OPS and a page buffer control signal PBSIG in response to a command CMD, and output a row address RADD and a column address CADD in response to an address ADD. The control logic 111 may be implemented as hardware, software, or a combination of hardware and software. For example, the control logic 111 may be a control logic circuit operating in accordance with an algorithm and/or a processor executing control logic code.

The voltage generator 112 may generate operating voltages Vop needed for a program operation, a read operation, or an erase operation, in response to an operating signal OPS. For example, the voltage generator 112 may generate and output operating voltages Vop such as a program voltage, a read voltage, an erase voltage, and a pass voltage.

The row decoder 113 may transmit operating voltages Vop to a selected memory block through the local lines LL in response to a row address RADD.

The page buffer group 114 may include a plurality of page buffers coupled with the bit lines BL. The page buffer group 114 may temporarily store data in response to a page buffer control signal PBSIG during a program operation or a read operation.

The column decoder 115 may transmit data between the page buffer group 114 and the input/output circuit 116 in response to a column address CADD.

The input/output circuit 116 may receive a command CMD and an address ADDR from an external device and transmit the command CMD and the address ADDR to the control logic 111. The input output circuit 116 may transmit data DATA received from the external device to the column decoder 115 during a program operation, and output data DATA received from the column decoder 115 to the external device during a read operation.

Figure 2:
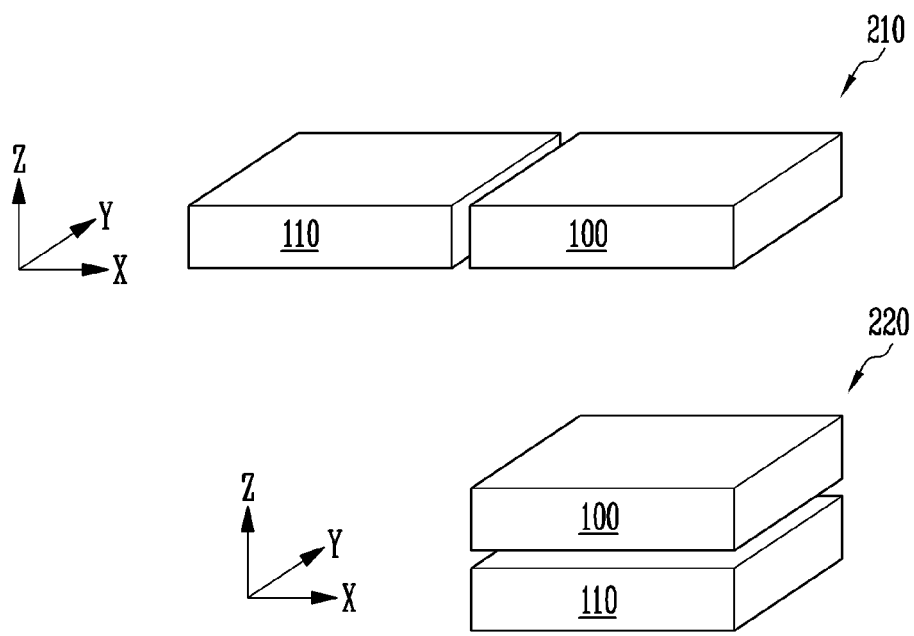
FIG. 2 is a diagram for describing arrangements between a memory cell array and peripheral circuits in accordance with an embodiment.

FIG. 2 is a diagram for describing arrangements between the memory cell array 100 and the peripheral circuits 110 in accordance with an embodiment.

Referring to FIG. 2, the memory cell array 100 and the peripheral circuits 110 described with reference to FIG. 1 may be arranged in various structures. For example, in the case where the substrate is disposed in parallel with an X-Y direction, the memory cell array 100 and the peripheral circuits 110 may be disposed in parallel with each other in the X-Y direction (as indicated by reference numeral 210). Alternatively, the memory cell array 100 may be disposed over the peripheral circuits 110 in a direction (a Z direction) perpendicular to the substrate (as indicated by reference numeral 220). In other words, the peripheral circuits 110 may be disposed between the substrate and the memory cell array 100.

Figure 3:
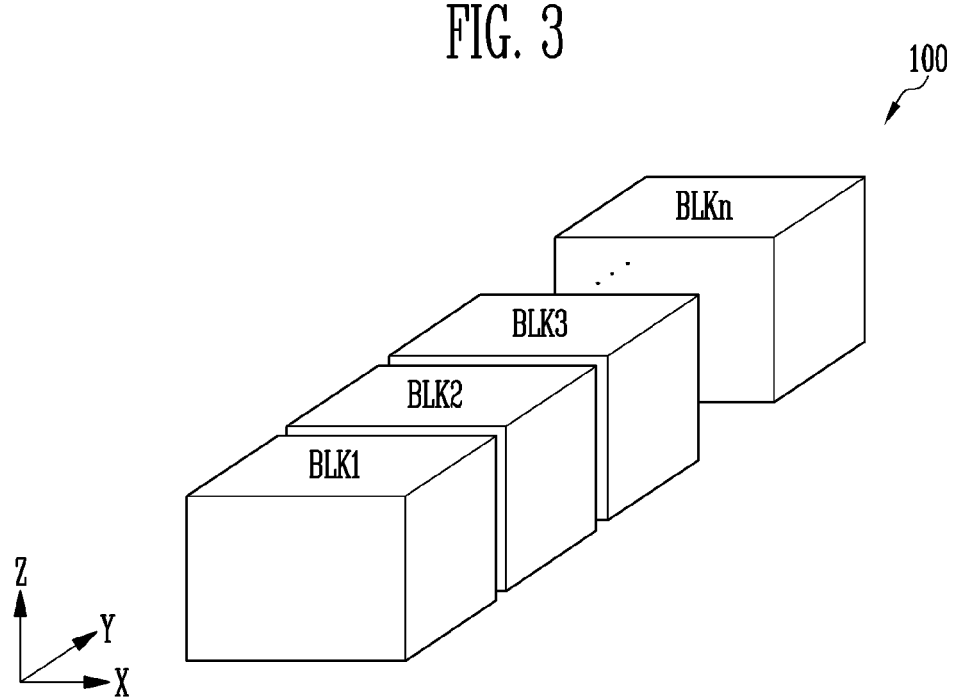
FIG. 3 is a diagram illustrating a memory cell array including memory blocks each having a three-dimensional structure in accordance with an embodiment.

FIG. 3 is a diagram illustrating a memory cell array including memory blocks each having a three-dimensional structure in accordance with an embodiment.

Referring to FIG. 3, in the case where the memory cell array 100 includes memory blocks BLK1 to BLKn each having a three-dimensional structure, the memory blocks BLK1 to BLKn may be arranged in the Y direction. The Y direction may be a direction in which the bit lines BL of FIG. 1 extend.

Although FIG. 3 illustrates that the memory cell array 100 includes a single plane, the memory cell array 100 may include a plurality of planes. The plurality of planes may be arranged in the X direction. Memory blocks included in each plane may be arranged in the Y direction in the corresponding plane.

Figure 4:
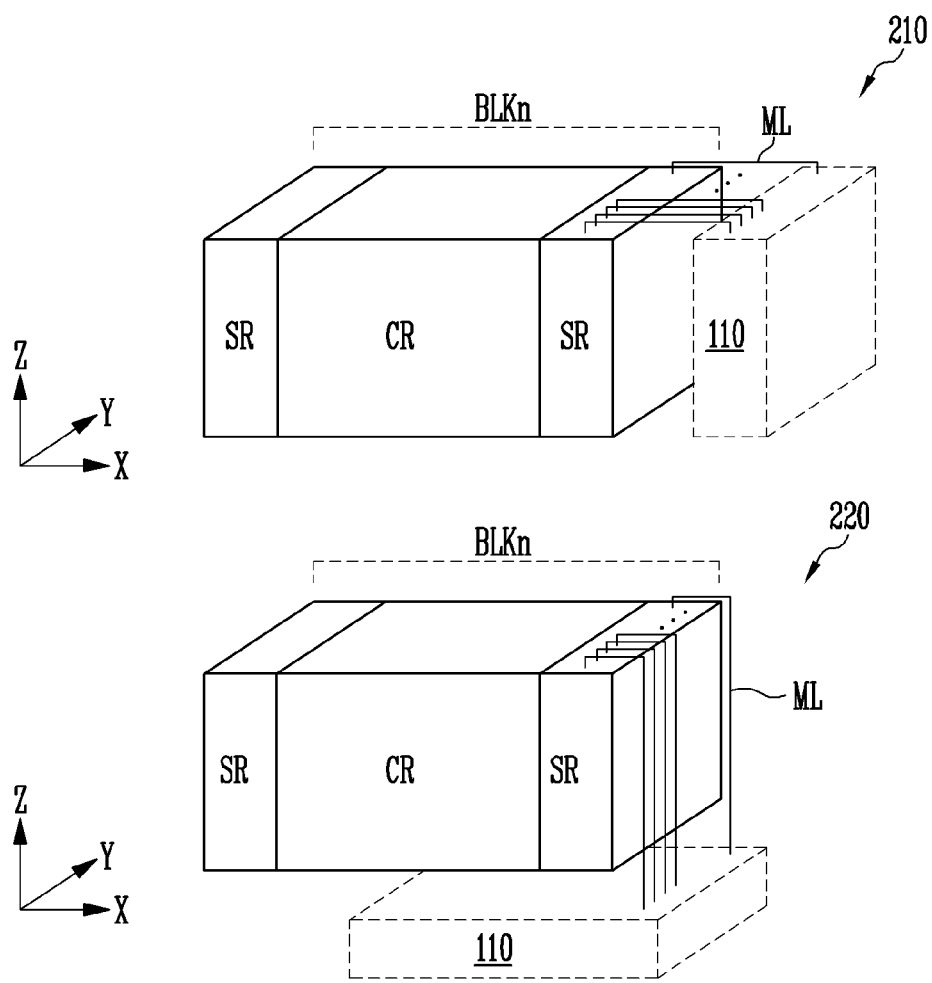
FIG. 4 is a diagram for describing the configuration of a memory block and connection relationship between the memory block and peripheral circuits in accordance with an embodiment.

FIG. 4 is a diagram for describing the configuration of a memory block BLKn and connection relationship between the memory block BLKn and the peripheral circuits 110 in accordance with an embodiment.

The plurality of memory blocks BLK1 to BLKn described with reference to FIG. 3 may have the same configuration. FIG. 4 illustrates any one memory block BLKn as a representative example of the plurality of memory blocks BLK1 to BLKn.

Referring to FIG. 4, the memory block BLKn having a three-dimensional structure may include a cell region CR including memory cells, and a slimming region SR provided to electrically couple the peripheral circuits 110 with the cell region CR. For example, the cell region CR may include a plurality of vertical strings obtained by stacking memory cells and select transistors. The slimming region SR may include ends of a plurality of gate lines coupled to the memory cells and the select transistors. For example, in the slimming region SR, the gate lines may be stacked in a stepped structure in which a gate line disposed at a relatively lower position extends a length longer than that of a gate line disposed at a relatively upper position. Exposed portions of the gate lines having the stepped structure may be coupled to the peripheral circuits 110 through contact plugs.

In the case where, as indicated by reference numeral 210, the peripheral circuits 110 and the memory block BLKn are disposed in the horizontal direction (the X direction), a plurality of lines ML for electrically coupling the slimming region SR with the peripheral circuits 110 may be formed. For example, in the structure indicated by reference numeral 210, the plurality of lines ML may extend in the X direction and be disposed at positions spaced apart from each other in the Y direction.

In the case where, as indicated by reference numeral 220, the peripheral circuits 110 are disposed under the memory block BLKn (in the Y direction), a plurality of lines ML for electrically coupling the slimming region SR with the peripheral circuits 110 may extend in the Z direction and be disposed at positions spaced apart from each other in the Y direction.

Figure 5:
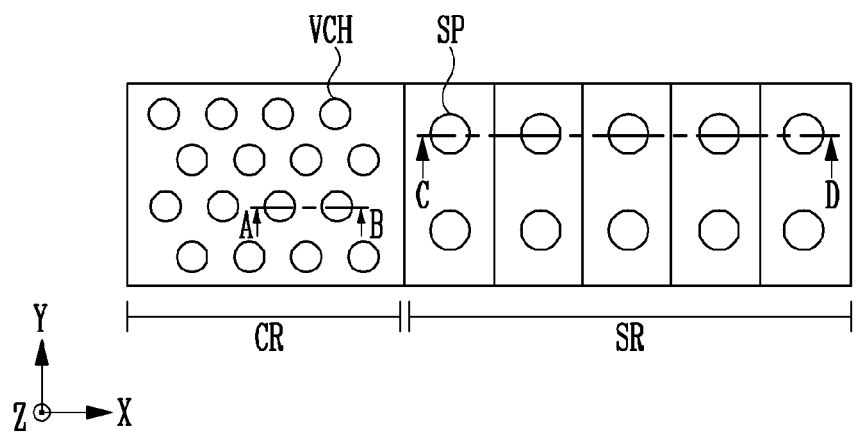
FIG. 5 is a diagram illustrating a layout of a cell region and a slimming region in accordance with an embodiment.

FIG. 5 is a diagram illustrating a layout of the cell region CR and the slimming region SR in accordance with an embodiment.

Referring to FIG. 5, a plurality of vertical channel structures VCH may be formed in the cell region CR. A plurality of support structures SP may be formed in the slimming region SR. The vertical channel structures VCH may vertically pass through a structure stacked in the Z direction in the cell region CR and include a plurality of memory cells. The support structures SP may support the stacked structure formed in the memory block.

The support structures SP may vertically pass through a structure stacked in the Z direction in the slimming region SR and have the same structure as that of the vertical channel structures VCH.

In an embodiment of the present disclosure, because the support structures SP are formed simultaneously with formation of the vertical channel structures VCH, separate manufacturing steps for forming the support structures SP are not needed. Therefore, in a memory device in accordance with an embodiment of the present disclosure, the support structures SP may mitigate or prevent the memory block from being inclined. Because the support structures SP are formed simultaneously with formation of the vertical channel structures VCH, the manufacturing process may be facilitated.

The numbers of vertical channel structures VCH and support structures SP are not limited to those illustrated in FIG. 5, and may be changed depending on the size of the memory block or the number of stacked layers included in the stacked structure.

In the following embodiments, a method of manufacturing the vertical channel structures VCH and the structure of the cell region CR will be described with reference to a cross-section taken along line A-B, and a method of manufacturing the support structures SP and the structure of the slimming region SR will be described with reference to a cross-section taken along line C-D.

FIGS. 6 to 13 are diagrams for describing a method of manufacturing a memory device in accordance with a first embodiment of the present disclosure.

Figure 6:
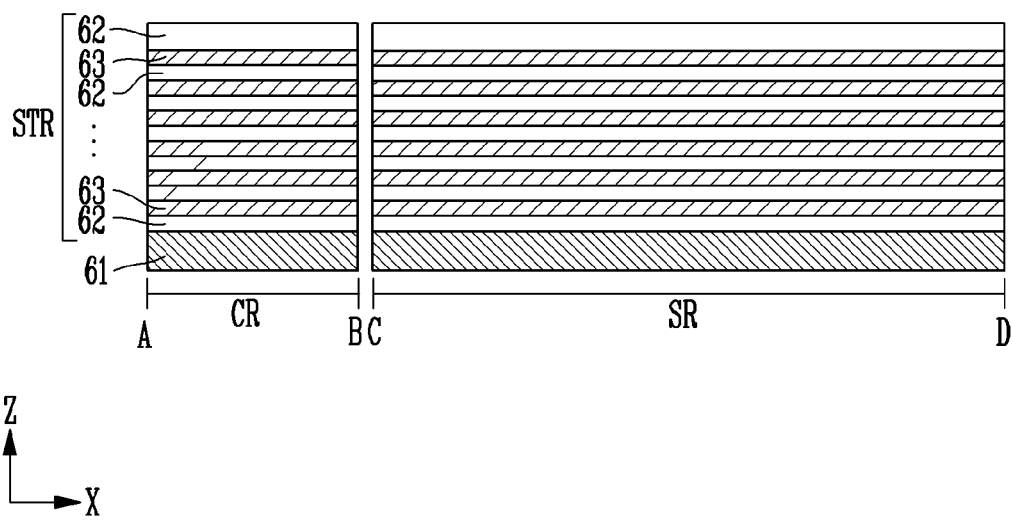
FIGS. 6 to 13 are diagrams for describing a method of manufacturing a memory device in accordance with a first embodiment of the present disclosure.

Referring to FIG. 6, in the first embodiment, there is illustrated a single stack structure in which one stacked structure STR is formed on a base 61.

The stacked structure STR may be formed on the base 61. The base 61 may be a semiconductor substrate, and include a lower structure such as a peripheral circuit and a source structure.

The stacked structure STR may include first material layers 62 and second material layers 63 that are alternately stacked. The first material layers 62 may be provided to insulate stacked gate electrodes from each other. The second material layers 63 may be provided to form the gate electrodes such as memory cells and select transistors. The second material layers 63 may be made of material having a high etch selectivity with respect to the first material layers 62. For example, the second material layers 63 may be sacrificial layers including nitride or the like, and the first material layers 62 may be insulating layers including oxide or the like. Alternatively, the second material layers 63 may be conductive layers including polysilicon, tungsten, or the like, and the first material layers 62 may be insulating layers including oxide or the like. A second material layer 63 may be formed on the uppermost end of the stacked structure STR.

Figure 7:
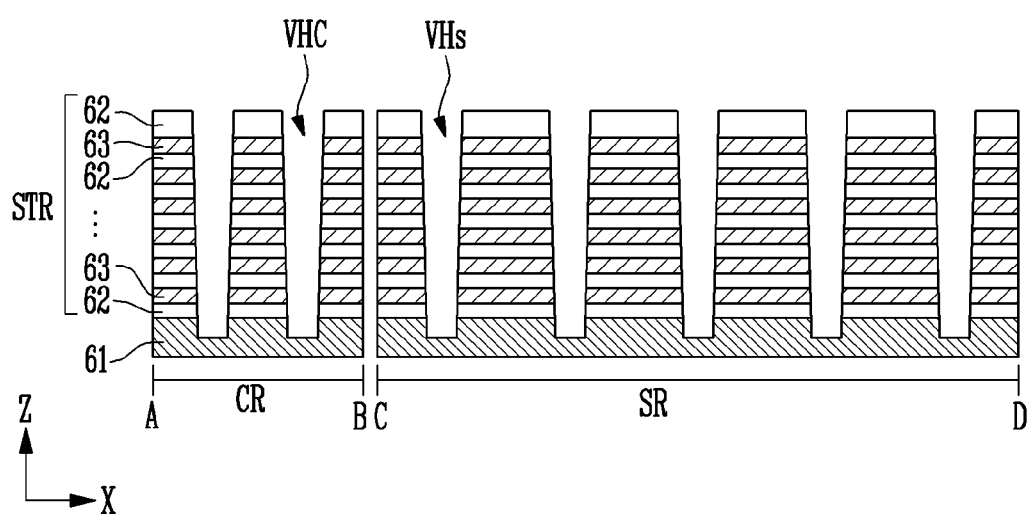

Referring to FIG. 7, vertical holes VHc and VHs that vertically pass through the stacked structure STR may be formed. For example, in the cell region CR and the slimming region SR, a mask pattern (not illustrated) having a plurality of openings may be formed on the second material layer 63 formed on the uppermost end of the stacked structure STR. Portions of the stacked structure STR that are exposed through the openings may be etched. The etch process may be performed until the base 61 is exposed.

Through a subsequent process, vertical channel structures (VCH of FIG. 5) may be formed in the vertical holes VHc formed in the cell region CR, and support structures (SP of FIG. 5) may be formed in the vertical holes VHs formed in the slimming region SR. Therefore, as illustrated in FIG. 5, the vertical holes VHc formed in the cell region CR may be arranged in a zigzag pattern, and the vertical holes VHs formed in the slimming region SR may be arranged in the form of a matrix pattern along the X direction and the Y direction. However, the vertical holes VHc and VHs may be arranged in various patterns as well as the patterns illustrated in FIG. 5, and the arrangement patterns and the shapes of the vertical holes VHc and VHs in accordance with an embodiment are not limited to those illustrated in FIG. 5.

Figure 8:
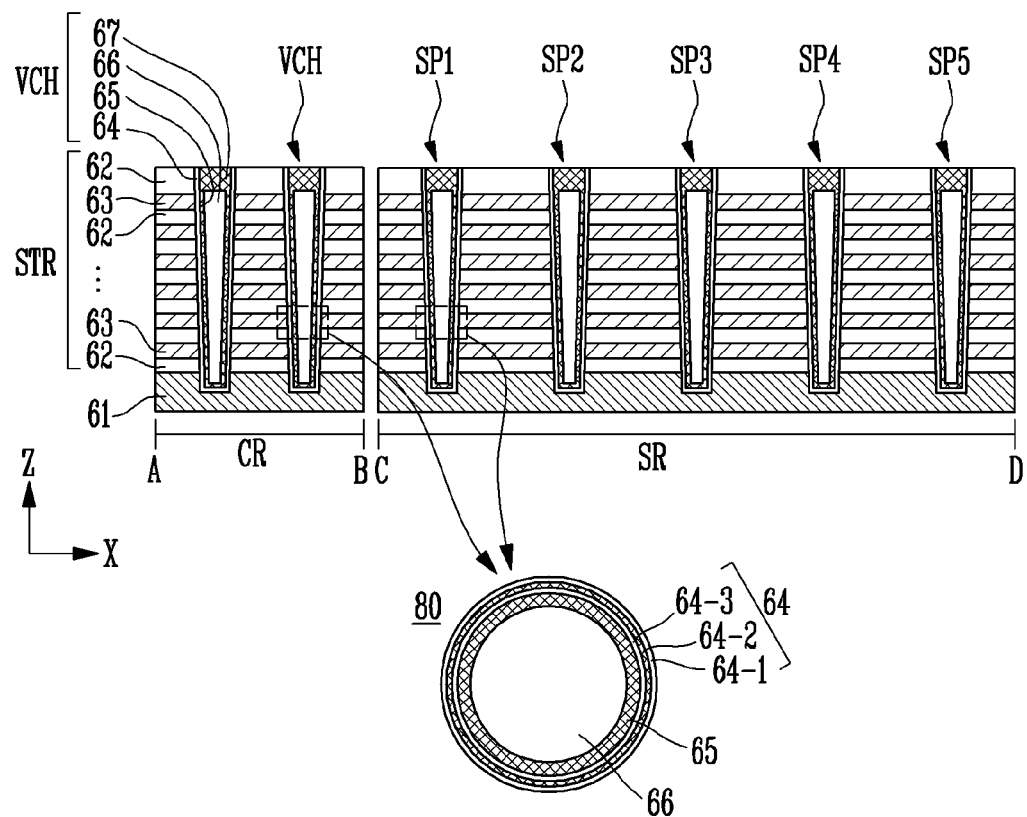

Referring to FIG. 8, the vertical channel structures VCH may be formed in the vertical holes VHc of the cell region CR. The support structures SP1 to SP5 may be formed in the vertical holes VHs of the slimming region SR. The support structures SP1 to SP5 may have the same structure as that of the vertical channel structures VCH and be formed simultaneously with formation of the vertical channel structures VCH.

The vertical channel structures VCH formed in the cell region CR and the support structures SP1 to SP5 each may include a memory layer 64, a channel layer 65, a vertical insulating layer 66, and a capping layer 67 that are formed in the order of proximity to an inner surface of the vertical hole VHc, VHs. The memory layer 64 may be formed in a hollow cylindrical shape along the inner surface of the vertical hole VHc, VHs. The channel layer 65 may be formed in a hollow cylindrical shape along an inner surface of the memory layer 64. The vertical insulating layer 66 may be provided in the form of a cylinder with which space defined by the channel layer 65 is filled. Although not illustrated, in various embodiments, the channel layer 65 may be provided in the form of a cylinder. In this case, the vertical insulating layer 66 may not be formed. The capping layer 67 may be formed on the channel layer 65 and the vertical insulating layer 66 and be enclosed by the memory layer 64.

In the cell region CR, portions of each vertical channel structure VCH that are adjacent to the second material layers 63 may be used as memory cells. The support structures SP1 to SP5 formed in the slimming region SR may be used to support the stacked structure STR.

The structure of the vertical channel structures VCH and the support structures SP1 to SP5 are described in more detail with reference to diagramed view 80. The memory layer 64 may include a blocking layer 64_1, a trap layer 64_2, and a tunnel insulating layer 64_3 that are formed in the order of proximity to the vertical hole VHc, VHs.

The blocking layer 64_1 may be formed of an insulating layer including oxide or the like. The trap layer 64_2 may be made of material, e.g., poly-silicon, nitride, variable resistance material, or phase-change material, capable of trapping charges. The tunnel insulting layer 64_3 may be formed of an insulating layer including oxide or the like. The channel layer 65 may be formed of poly-silicon. The vertical insulting layer 66 may be formed of an insulating layer including oxide or the like. Data may be stored in the vertical channel structures VCH formed in the cell region CR. In detail, data may be stored in the trap layers 64_2 of the vertical channel structure VCH.

Figure 9:
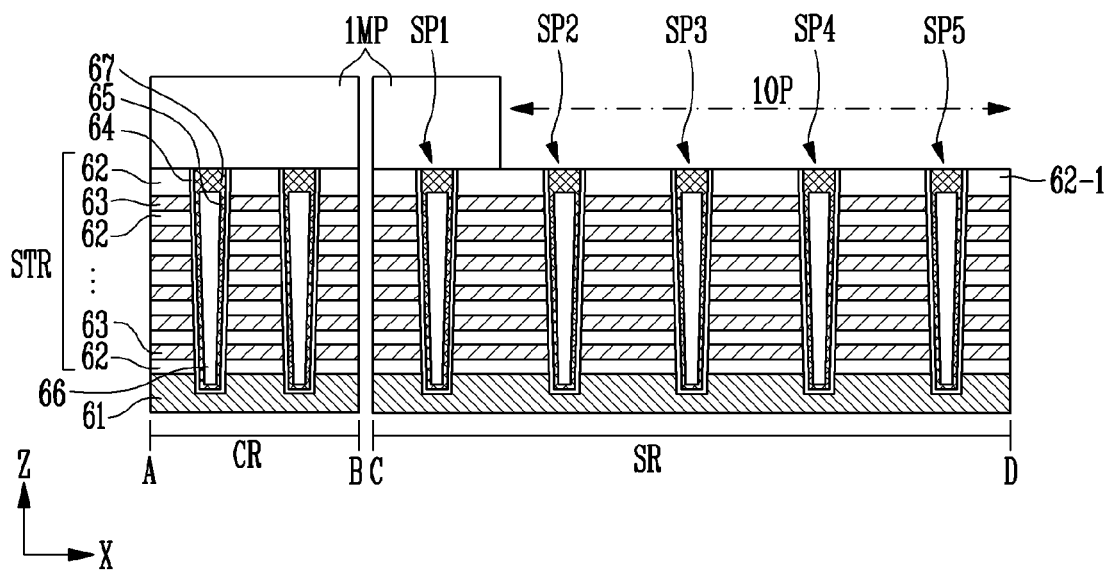

Referring to FIG. 9, a slimming process of exposing each of the second material layers 63 in the slimming region SR may be performed. In detail, the slimming process may include a plurality of mask pattern forming steps and etching steps so as to form, in the slimming region SR, a stepped structure having a plurality of stairs each having a pair of first and second material layers 62 and 63. FIG. 9 illustrates a method of forming a first mask pattern 1MP for forming a first stepped structure.

At the mask pattern forming step, the first mask pattern 1MP may be formed on the entirety of the cell region CR and a portion of the slimming region SR. The first mask pattern 1MP may include a first opening 1OP through which target material to be etched is exposed in the slimming region SR. For example, the first mask pattern 1MP may be formed to cover the entirety of the cell region CR and a portion of the slimming region SR. In other words, the second to fifth support structures SP2 to SP5 and a portion of the first material layer 62_1 formed at an uppermost position among the first and second material layers 62 and 63 may be exposed through the first opening 10P of the first mask pattern 1MP.

Figure 10:
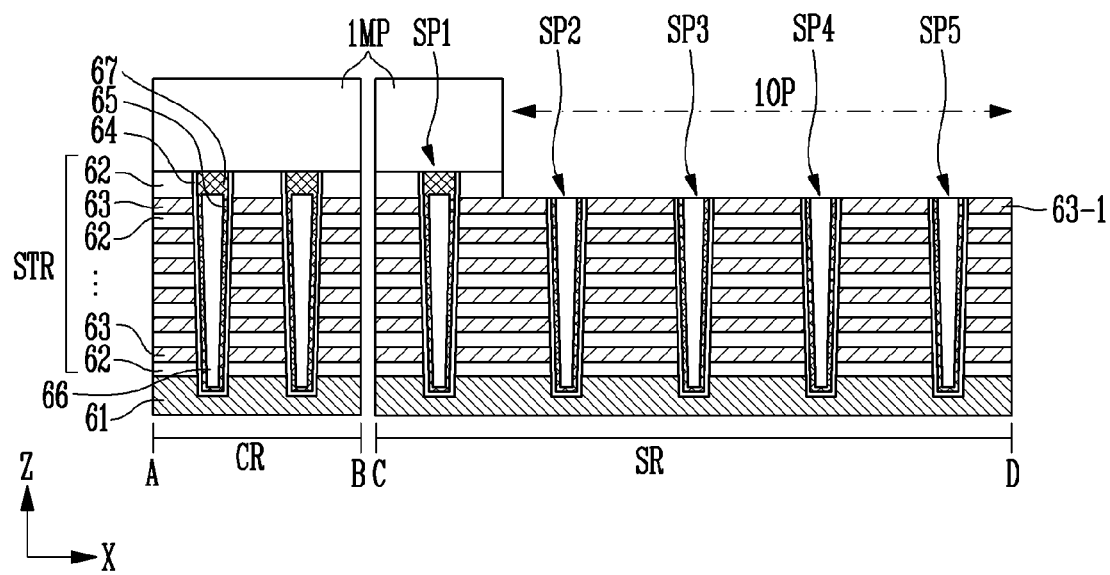

Referring to FIG. 10, at the etching step, an etching process may be performed so that the second material 63_1 is exposed by removing the portion of the uppermost first material layer 62_1 that is exposed through the first opening 10P. The etching process may be performed in an anisotropic etching manner so that only the exposed portion is removed through the first opening 10P. The etching process using the first mask pattern 1MP may be performed until the second material layer 63_1 is exposed in the slimming region SR.

At the etching step, upper portions of the second to fifth support structures SP2 to SP5 that are exposed through the first opening 10P may also be removed when the exposed portion of the first material layer 62_1 is removed. Although FIG. 10 illustrates that upper surfaces of the second to fifth support structures SP2 to SP5 and an upper surface of the second material layer 63_1 are level with each other, the upper portions of the second to fifth support supports SP2 to SP5 may remain unlevel with the upper surface of the second material layer 63_1. For example, the upper surfaces of the second to fifth support structures SP2 to SP5 may remain protruding from the upper surface of the second material layer 63_1. Also, heights of residual portions of the layers in each of the second to fifth support structures SP2 to SP5 may differ from each other depending on etch selectivities of the layers. In an embodiment of the present disclosure, the first to fifth support structures SP1 to SP5 formed in the slimming region SR perform only a function of supporting the stacked structure STR without performing an electrical operation. In such case, shapes of the residual portions of the first to fifth support structures SP1 to SP5 may vary.

Figure 11:
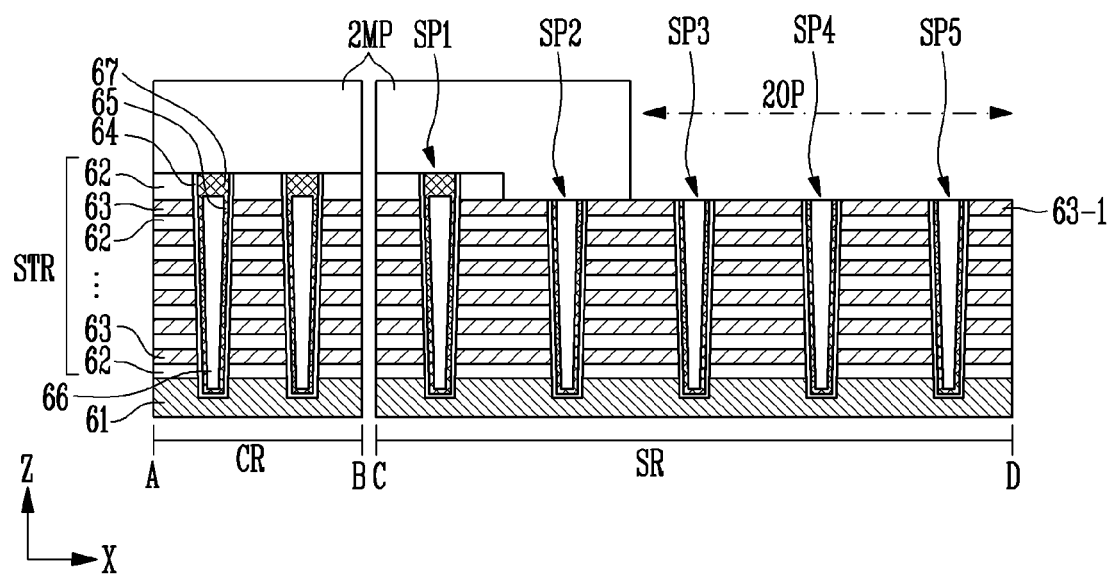

Referring to FIG. 11, if the second material layer 63_1 is exposed in the slimming region SR, the first mask pattern (1MP of FIG. 10) may be removed, and a second mask pattern 2MP including a second opening 20P may be formed. To form a stepped structure, the second opening 20P of the second mask pattern 2MP may be less in width than the first opening 10P. For example, the second mask pattern 2MP may be formed to cover the entirety of the cell region CR and a portion of the slimming region SR. In other words, the third to fifth support structures SP3 to SP5 and a portion of the second material layer 63_1 formed at an uppermost position among the first and second material layers 62 and 63 may be exposed through the second opening 20P of the second mask pattern 2MP.

Figure 12:
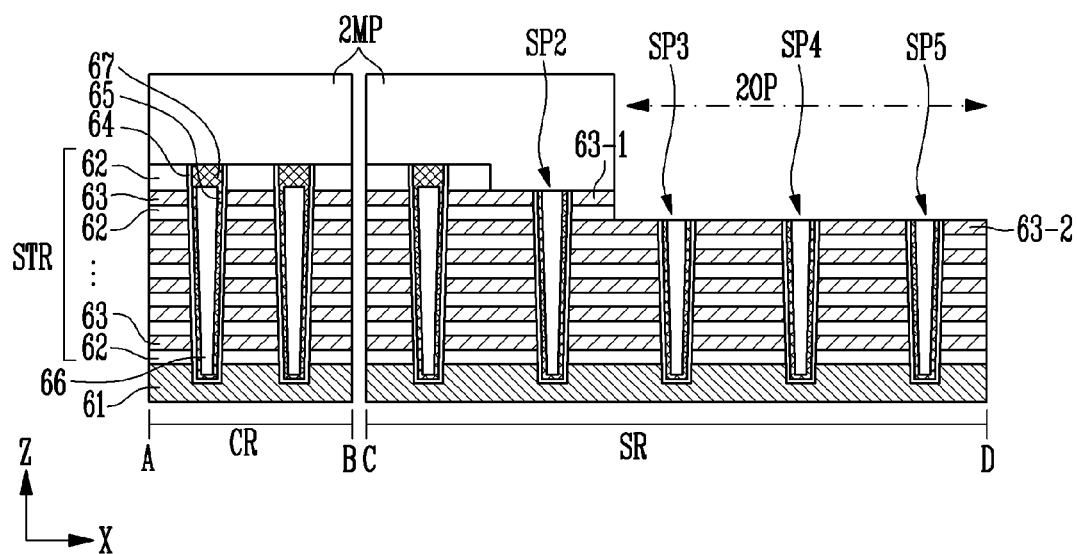

Referring to FIG. 12, an etching process may be performed so that the second material layer 63_2 is exposed by removing a portion of the uppermost second material layer 63_1 that is exposed through the second opening 20P and a portion of the first material 62 that is formed under the second material 63_1. The etching process may be performed in an anisotropic etching manner so that only the exposed portion is removed through the second opening 20P. The etching process using the second mask pattern 2MP may be performed until the second material layer 63_2 is exposed in the slimming region SR.

At the etching step, upper portions of the third to fifth support structures SP3 to SP5 that are exposed through the second opening 20P may also be removed when the exposed portion of the second material 63_1 and the exposed portion of the first material layer 62 are removed. Although FIG. 11 also illustrates that the upper surfaces of the third to fifth support structures SP3 to SP5 are level with the upper surface of the second material layer 63_2, the shapes of the exposed portions of the third to fifth support structures SP3 to SP5 are not necessarily level with the upper surface of the second material layer 63_2 in other embodiments of the present disclosure, as described with reference to FIG. 10.

Figure 13:
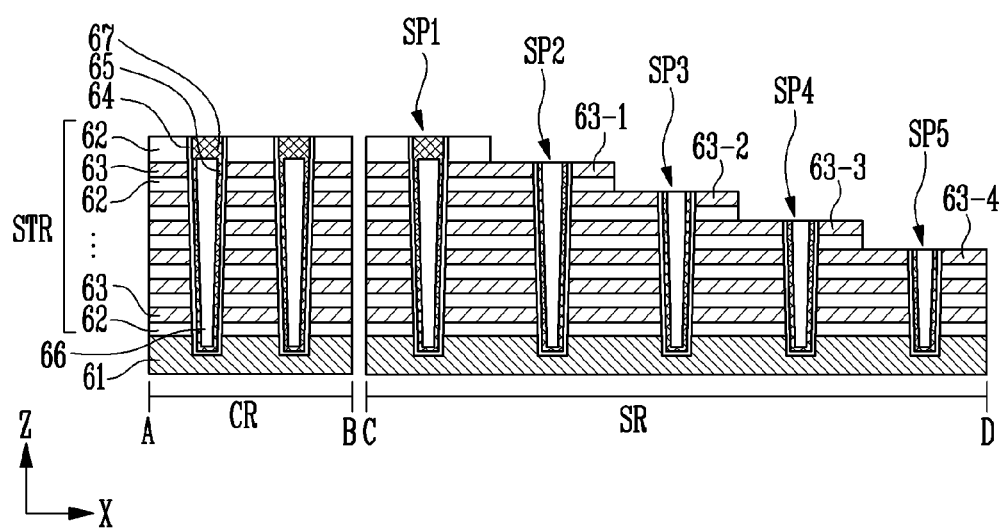

Referring to FIG. 13, the second mask pattern 2MP may be removed. According to the mask pattern forming steps and the etching steps described with reference to FIGS. 9 to 12, a stepped structure may be formed in the slimming region SR by using mask patterns having openings that are gradually reduced in width. For example, a stepped structure in which the second material layers 63_1, 63_2, 63_3, 63_4, . . . are exposed on respective stairs may be formed in the slimming region SR. Because the slimming process is performed in only the slimming region SR, the vertical channel structures VCH formed in the cell region CR may have the same height. Furthermore, in the slimming region SR, support structures that pass through the same layer may have the same height, but support structures that pass through different layers may have different heights. For instance, although the second support structures SP2 may have the same height, the second support structures SP2 may have a different height from the third support structures SP3.

As described with reference to FIGS. 6 to 13, after the vertical channel structures VCH and the support structures SP1 to SP5 are simultaneously formed in the cell region CR and the slimming region SR, a slimming process for forming a stepped structure in the slimming region SR is performed. Hence, a separate process for forming the support structures SP1 to SP5 may not be needed. Consequently, a phenomenon in which the memory block is inclined may be mitigated of prevented by using the support structures SP1 to SP5 without performing a separate additional process.

Figure 14:
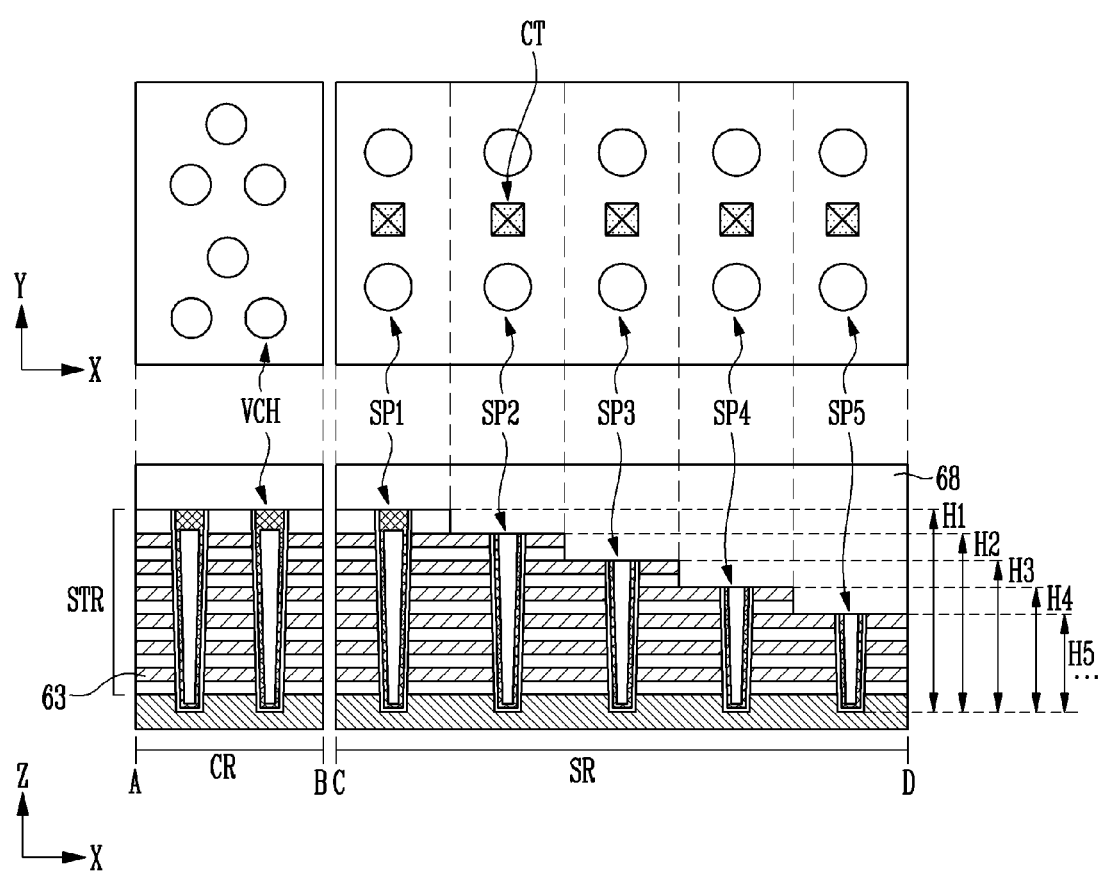
FIG. 14 is a diagram illustrating the structure of the completed memory device in accordance with the first embodiment of the present disclosure.

FIG. 14 is a diagram illustrating the structure of the completed memory device in accordance with the first embodiment of the present disclosure.

Referring to FIG. 14, each of the support structures SP1 to SP5 that are formed by the manufacturing method described with reference to FIGS. 6 to 13 may be formed to pass through a central area of the corresponding stair in a vertical direction (the Z direction). When the slimming process of forming the stepped structure in the slimming region SR is completed, the first to fifth support structures SP1 to SP5 formed in the slimming region SR may have different heights depending on the shape of the stacked structure STR. For example, the first support structure SP1 may have a first height H1 equal to that of the vertical channel structure VCH. The second support structure SP2 may have a second height H2 less than the first height H1. In this way, the first to fifth support structures SP1 to SP5 may have different heights H1 to H5. Here, the term "height" means a length from the bottom of each of the first to fifth support structures SP1 to SP5 to the top thereof.

If the slimming process is completed, an interlayer insulating layer 68 may be formed in upper portions of the cell region CR and the slimming region SR. Contact plugs CT that come into contact with the respective second material layers 63 of the slimming region SR may be formed. The interlayer insulting layer 68 may be formed of an insulating layer including oxide or the like. In the case where the second material layers 63 of the stacked structure STR are formed as conductive layers, the contact plugs CT may vertically pass through the interlayer insulating layer 68 and come into contact with the second material layers 63 of the respective stairs. The contact plugs ST may be formed of conductive layers. If the second material layers 63 are formed as sacrificial layers, the second material layers 63 may be removed, and a process of charging conductive layers for gates may be further performed. After the conductive layers for gates have been charged, the interlayer insulating layer 68 may be formed on the entire structure, and the contact plugs CT that come into contact with conductive layers of the respective stairs.

Although FIG. 14 illustrates that the support structures SP1 to SP5 are formed in central areas of the respective stairs of the stepped structure, the locations at which the support structures SP1 to SP5 are formed are not limited thereto. A second embodiment in which the support structures SP1 to SP5 are formed at locations different from that of the first embodiment will be described below.

Figure 15:
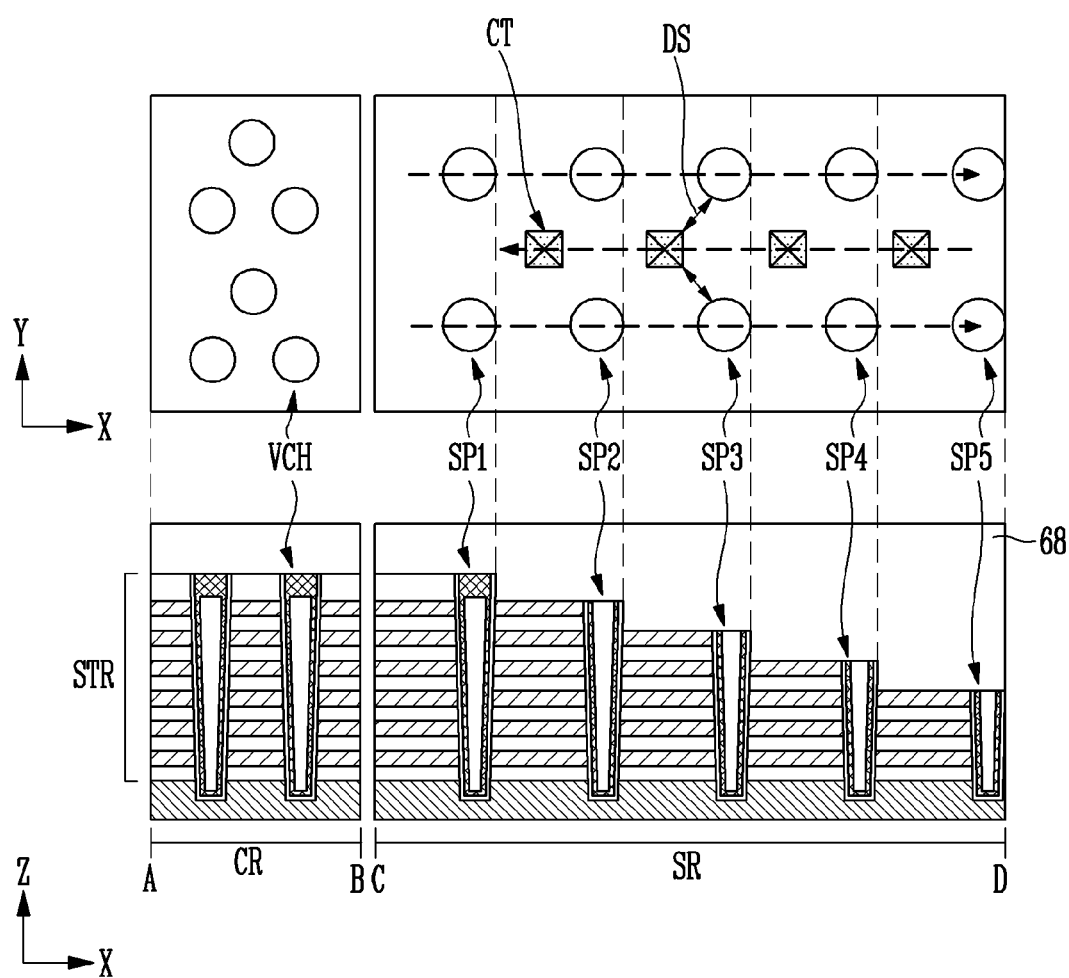
FIG. 15 is a diagram illustrating the structure of a completed memory device in accordance with a second embodiment of the present disclosure.

FIG. 15 is a diagram illustrating the structure of a completed memory device in accordance with a second embodiment of the present disclosure.

Referring to FIG. 15, the support structures SP1 to SP5 may be formed to abut on ends of the respective stairs of the stepped structure. For example, the first support structure SP1 may be formed to abut on the end of the uppermost stair. The second support structure SP2 may be formed to abut on the end of a stair below the uppermost stair.

In this way, if the first to fifth support structures SP1 to SP5 are formed to abut on the ends of the respective stairs, a distance DS between the contact plugs CT and the first to fifth support structures SP1 to SP5 may be increased. Hence, the manufacturing process may be facilitated. When voltages are applied to the contact plugs CT during a follow-up operation, electrical coupling between the contact plugs CT and the first to fifth support structures SP1 to SP5 may be prevented from occurring. For example, in the case where the distance DS between the contact plugs CT and the first to fifth support structures SP1 to SP5 is relatively small, coupling may occur between the contact plugs CT and the first to fifth support structures SP1 to SP5. Therefore, in the second embodiment, an increase in the distance DS between the contact plugs CT and the first to fifth support structures SP1 to SP5 may prevent the reliability of the memory device from deteriorating.

Although the manufacturing method and the structure of the single stack structure have been described in the first and second embodiments, various embodiments of the present disclosure may be applied to a multi-stack structure in which two or more stacked structures are stacked. Detailed description pertaining to the multi-stack structure is made with reference to the following drawings.

FIGS. 16 to 21 are diagrams for describing a method of manufacturing a memory device and the structure of the completed memory device in accordance with a third embodiment of the present disclosure.

Figure 16:
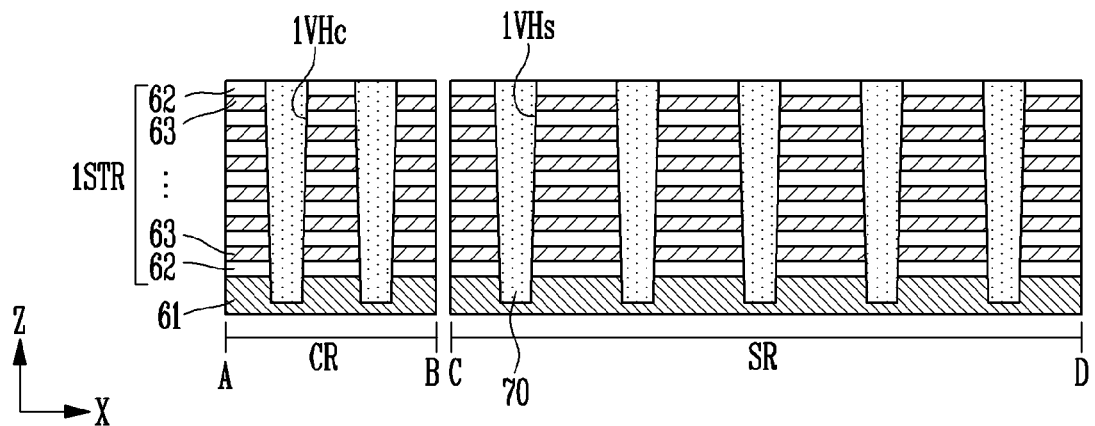
FIGS. 16 to 21 are diagrams for describing a method of manufacturing a memory device and the structure of the completed memory device in accordance with a third embodiment of the present disclosure.

Referring to FIG. 16, a first stacked structure 1STR may be formed on a base 61. The first stacked structure 1STR may include first material layers 62 and second material layers 63 that are alternately stacked. The base 61, the first material layers 62, and the second material layers 63 have been described in the first embodiment; therefore, a repetitive explanation thereof is omitted.

Thereafter, first vertical holes 1VHc and 1VHs which vertically pass through the first stacked structure 1STR and expose portions of the base 61 may be formed. The first vertical holes 1VHc and 1VHs may be filled with sacrificial layers 70. The sacrificial layers 70 may be formed of material having an etch selectivity higher than that of the first and second material layers 62 and 63 so that the sacrificial layers 70 may be removed during a subsequent etching process. The first vertical holes 1VHc formed in the cell region CR may be used to form vertical channel structures. The first vertical holes 1VHs formed in the slimming region SR may be used to form support structures.

Figure 17:
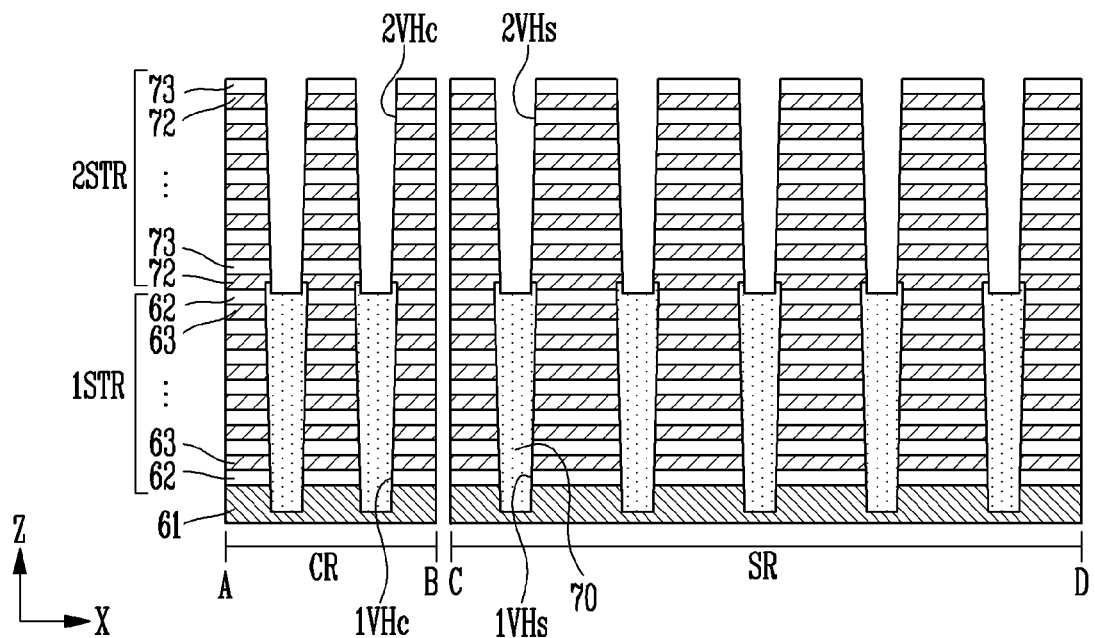

Referring to FIG. 17, a second stacked structure 2STR may be formed on the first stacked structure 1STR provided with the sacrificial layer 70. The second stacked structure 2STR may include third material layers 72 and fourth material layers 73 that are alternately stacked. For example, the third material layers 72 may be made of the same material as that of the first material layers 62 of the first stacked structure 1STR. The fourth material layers 73 may be made of the same material as that of the second material layers 63 of the first stacked structure 1STR. A fourth material layer 73 may be formed on the uppermost end of the second stacked structure 2STR.

After the second stacked structure 2STR has been formed, second vertical holes 2VHc and 2VHs which vertically pass through the second stacked structure 2STR may be formed so that portions of the sacrificial layer 70 may be exposed through the second vertical holes 2VHc and 2VHs. For example, the second vertical holes 2VHc and 2VHs may be respectively formed over the first vertical holes 1VHc and 1VHs.

Figure 18:
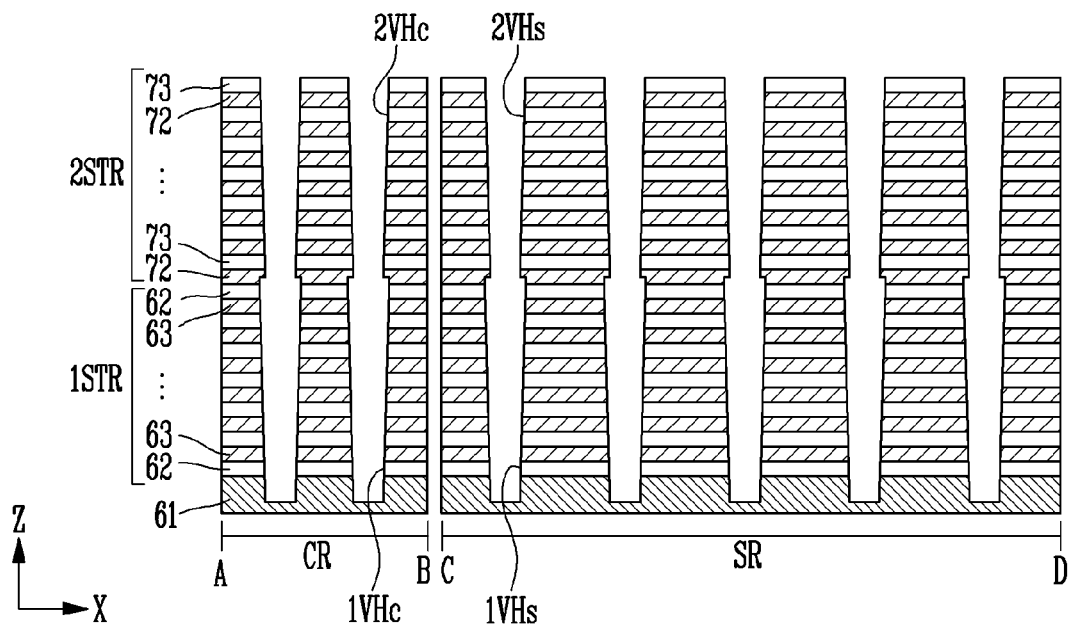

Referring to FIG. 18, the sacrificial layer (70 of FIG. 17) that is exposed through the second vertical holes 2VHc and 2VHs may be removed so that the first to fourth material layers 62, 63, 72, and 73 may be exposed through the first and second vertical holes 1VHc, 1VHs, 2VHc, and 2VHs.

Figure 19:
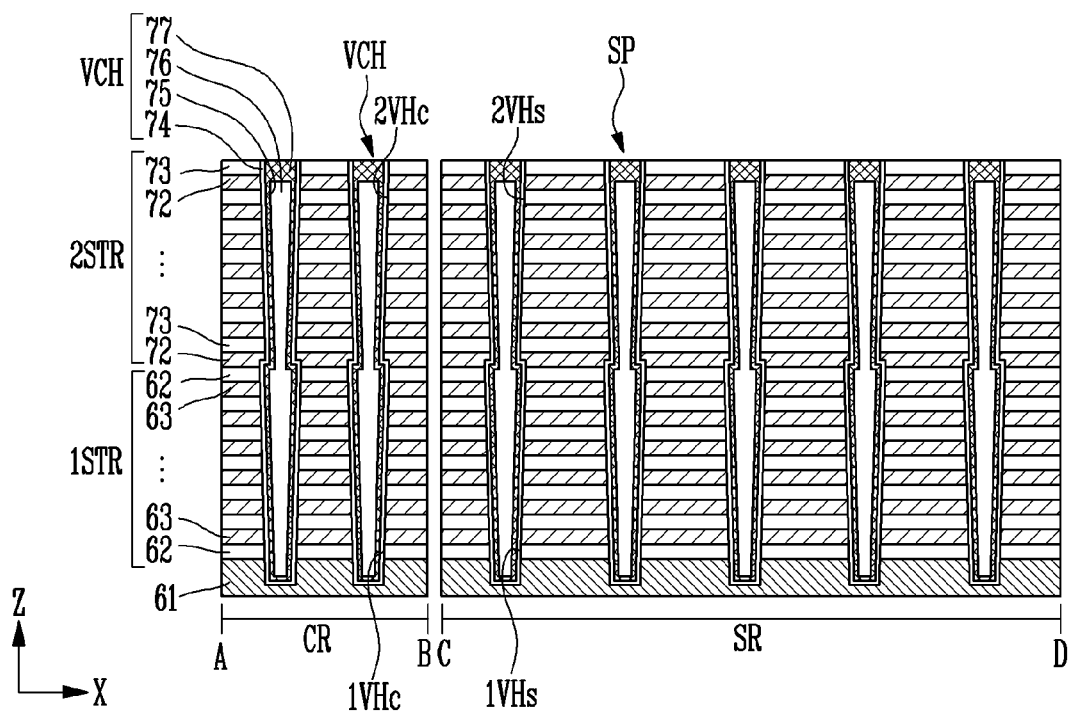

Referring to FIG. 19, vertical channel structures VCH and support structures SP each including the memory layer 74, the channel layer 75, the vertical insulating layer 76, and the capping layer 77 may be formed in the first and second vertical holes 1VHc, 1VHs, 2VHc, and 2VHs.

The memory layer 74 may be formed in a hollow cylindrical shape along an inner surface of each of the first and second vertical holes 1VHc, 1VHs, 2VHc, and 2VHs. The channel layer 75 may be formed in a hollow cylindrical shape along an inner surface of the memory layer 74. The vertical insulating layer 76 may be provided in the form of a cylinder with which space defined by the channel layer 75 is filled. Although not illustrated, in various embodiments, the channel layer 75 may be provided in the form of a cylinder. In this case, the vertical insulating layer 76 may not be formed. The capping layer 77 may be formed on the channel layer 75 and the vertical insulating layer 76 and be enclosed by the memory layer 74.

In the cell region CR, portions of each vertical channel structure VCH that are adjacent to the second and third material layers 63 and 72 may be used as memory cells. The support structures SP formed in the slimming region SR may be used to support the first and second stacked structures 1STR and 2STR.

Figure 20:
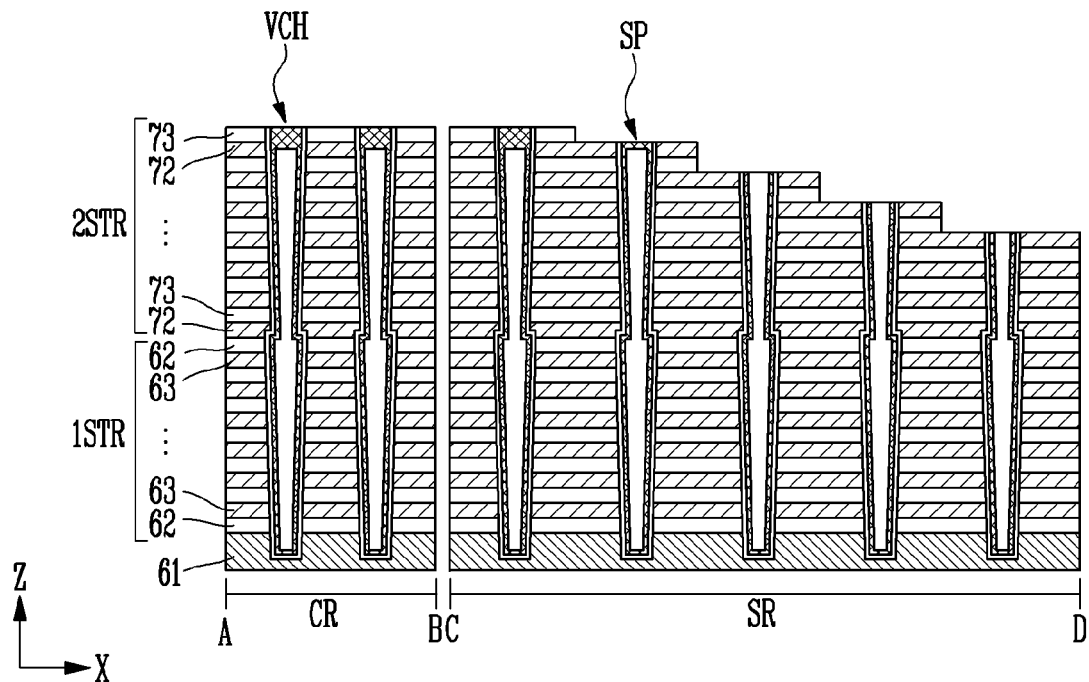

Referring to FIG. 20, a slimming process of slimming, to form a stepped structure, the first to fourth material layers 62, 63, 72, and 73 formed in the slimming region SR may be performed. During the slimming process, as described with reference to FIGS. 9 to 12, the mask pattern forming steps and the etching steps may be performed. During the slimming process, not only may the first to fourth material layers 62, 63, 72, and 73 exposed in the slimming region SR be etched, but the support structures SP may also be etched. However, in some embodiments of the present disclosure, the shape in which the support structures SP remain in the stepped structure may vary.

Figure 21:
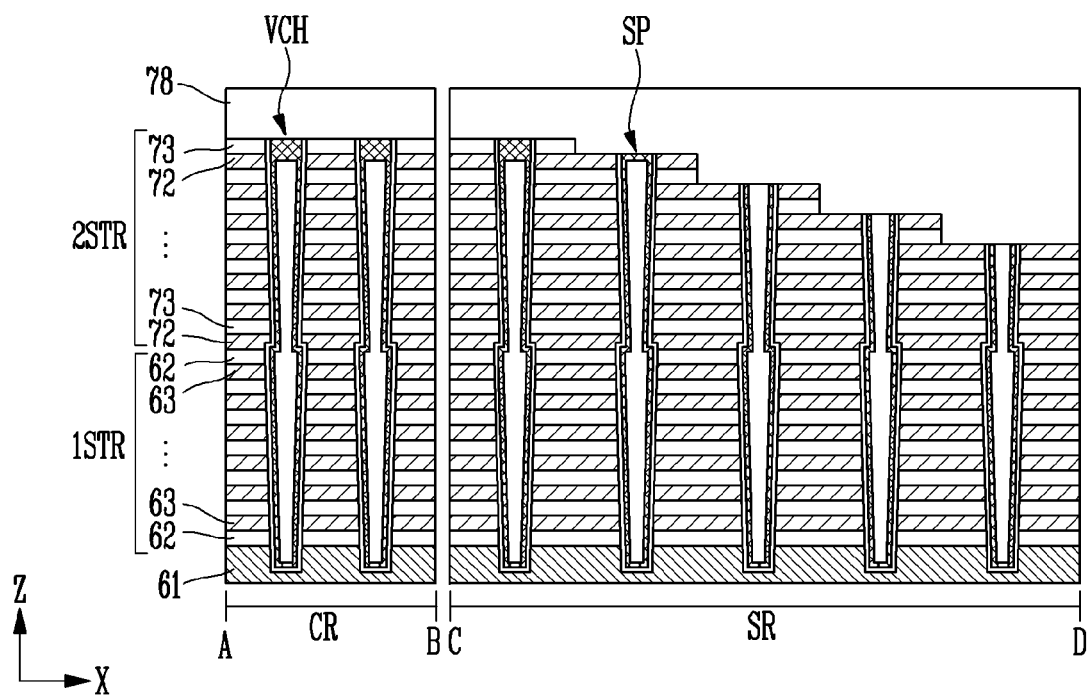

Referring to FIG. 21, after the stepped structure has been formed in the slimming region SR, an interlayer insulating layer 78 may be formed on the entire stepped structure.

After the vertical channel structures VCH and the support structures SP are simultaneously formed in the cell region CR and the slimming region SR, a slimming process for forming a stepped structure in the slimming region SR is performed. Hence, a separate process for forming the support structures SP may not be needed. Consequently, a phenomenon in which the memory block is inclined may be mitigated or prevented by using the support structures SP without performing a separate additional process.

Figure 22:
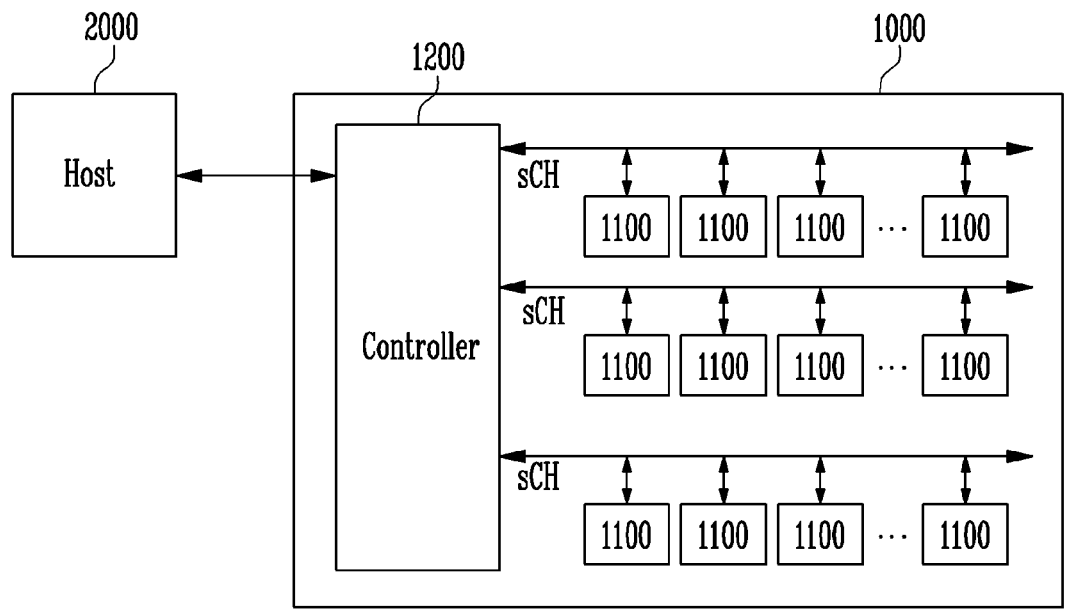
FIG. 22 is a block diagram illustrating an example of a memory system including a memory device in accordance with an embodiment of the present disclosure.

FIG. 22 is a block diagram illustrating an example of a memory system 1000 including a memory device in accordance with an embodiment of the present disclosure.

Referring to FIG. 22, the memory system 1000 may include a plurality of memory devices 1100 configured to store data, and a controller 1200 configured to communicate between the memory devices 1100 and a host 2000.

Each of the memory devices 1100 may be formed as the memory device described in one of the foregoing embodiments.

The memory devices 1100 may be coupled with the controller 1200 through a plurality of system channels sCH. For example, a plurality of memory devices 1100 may be coupled to each system channel sCH. The controller 1200 may be coupled with a plurality of system channels sCH.

The controller 1200 may communicate between the host 2000 and the memory devices 1100. The controller 1200 may control the memory devices 1100 in response to a request from the host 2000, or may perform a background operation for improving the performance of the memory system 1000 even when there is no request from the host 2000.

The host 2000 may generate requests for various operations and output the generated requests to the memory system 1000. For example, the requests may include a program request for controlling a program operation, a read request for controlling a read operation, and an erase request for controlling an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), and an integrated drive electronics (IDE) interface.

Figure 23:
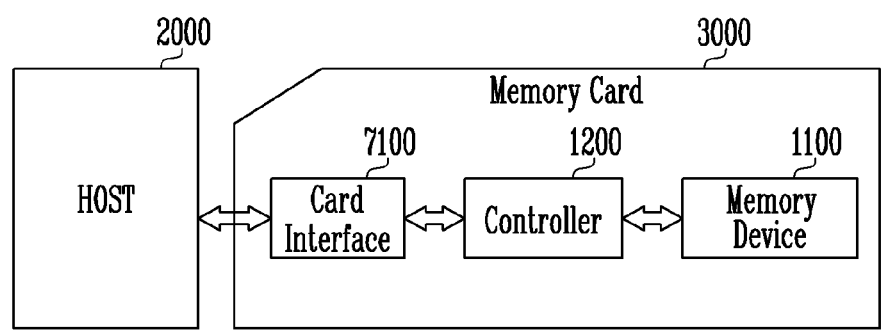
FIG. 23 is a block diagram illustrating an example of a memory system including a memory device in accordance with an embodiment of the present disclosure.

FIG. 23 is a block diagram illustrating an example of a memory system including a memory device in accordance with an embodiment of the present disclosure.

Referring to FIG. 23, the memory system may be implemented as a memory card 3000. The memory card 3000 may include a memory device 1100, a controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between the host 2000 and the controller 1200 according to a protocol of the host 2000. In an embodiment, the card interface 7100 may support a universal serial bus (USB) protocol, and an interchip (IC)-USB protocol. Here, the card interface 7100 may refer to hardware capable of supporting a protocol which is used by the host 2000, software installed in the hardware, or a signal transmission method.

When the memory card 3000 is connected to a host interface of the host 2000 such as a PC, a tablet PC, a digital camera, a digital audio player, a cellular phone, console video game hardware or a digital set-top box, the host interface may perform data communication with the memory device 1100 through the card interface 7100 and the controller 1200 under control of a microprocessor of the host 2000.

In various embodiments of the present disclosure, support structures may be formed in a slimming region of a memory block so that the memory block may be mitigated or prevented from being inclined. The support structures may be formed simultaneously with formation of vertical channel structures, whereby the process of manufacturing the memory device may be facilitated.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a memory device, the method comprising:
   providing a stacked structure having a cell region and a slimming region;
   forming vertical channel structures in the stacked structure in the cell region;
   forming support structures, in the stacked structure in the slimming region simultaneously with forming the vertical channel structures, wherein the support structures have the same structure as the vertical channel structures; and
   performing a slimming process so that the stacked structure in the slimming region and the support structures have a stepped structure.

2. The method according to claim 1, wherein simultaneously forming of the vertical channel structures and the support structures comprises:
   forming vertical holes in the stacked structure in the cell region and in the slimming region, the vertical holes passing through the stacked structure; and
   sequentially forming a memory layer, a channel layer, and a vertical insulating layer in each of the vertical holes formed in the cell region and in the slimming region.

3. The method according to claim 1, wherein the performing of the slimming process comprises:
   forming, on the stacked structure, a mask pattern including an opening through which a portion of the slimming region is exposed;
   simultaneously etching a portion of the stacked structure and portions of the support structures that are exposed through the opening; and
   removing the mask pattern,
   wherein forming the mask pattern, etching, and removing the mask pattern are repeated while an area of the opening is reduced, so that the material layers included in the stacked structure have a stepped shape.

4. The method according to claim 1, further comprising forming contact plugs coming into contact with conductive layers exposed through different layers in the stacked structure in the slimming region after the slimming process has been performed.

* * * * *